United States Patent
Cusack, Jr.

(10) Patent No.: US 6,498,654 B1
(45) Date of Patent: Dec. 24, 2002

(54) OPTICAL PROXIMITY DETECTOR

(75) Inventor: Francis J. Cusack, Jr., Groton, MA (US)

(73) Assignee: Harco Laboratories, Inc., Branford, CT (US)

( * ) Notice: Subject to any disclaimer, the term of this patent is extended or adjusted under 35 U.S.C. 154(b) by 312 days.

(21) Appl. No.: 09/591,658

(22) Filed: Jun. 9, 2000

Related U.S. Application Data

(60) Provisional application No. 60/138,622, filed on Jun. 11, 1999.

(51) Int. Cl.[7] .............................. G01B 11/14; G01J 4/00; G01R 33/02
(52) U.S. Cl. ................ 356/614; 250/227.17; 324/244.1
(58) Field of Search .................... 356/614, 364–368; 250/227.11, 227.17, 225, 231.1, 227.21; 324/244.1, 96

(56) References Cited

U.S. PATENT DOCUMENTS

| | | | |
|---|---|---|---|
| 4,516,073 A | 5/1985 | Doriath et al. ............ 324/244.1 |
| 4,560,932 A | 12/1985 | Mitsui et al. ................ 424/489 |
| 4,843,232 A * | 6/1989 | Emo et al. ................... 250/225 |
| 4,863,270 A | 9/1989 | Spillman, Jr. ............... 356/477 |
| 4,947,035 A | 8/1990 | Zook et al. .................. 250/225 |
| 5,136,235 A | 8/1992 | Brandle et al. ............... 324/96 |
| 5,149,962 A | 9/1992 | Maurice ................ 250/227.17 |
| 5,192,862 A | 3/1993 | Rudd, III ............... 250/227.21 |
| 5,214,377 A | 5/1993 | Maurice et al. ............. 324/204 |
| 5,321,258 A | 6/1994 | Kinney .................. 250/227.21 |
| 5,334,831 A | 8/1994 | Maurice ............... 250/227.17 |
| 5,399,853 A | 3/1995 | Maurice ................ 250/227.17 |
| 5,446,280 A * | 8/1995 | Wang et al. ........... 250/227.23 |
| 5,450,006 A * | 9/1995 | Tatam ......................... 324/96 |
| 5,479,094 A | 12/1995 | Esman et al. .................. 324/96 |
| 5,602,946 A | 2/1997 | Veeser et al. .................. 385/12 |
| 5,719,497 A | 2/1998 | Veeser et al. ............... 324/174 |
| 5,742,157 A | 4/1998 | Ishizuka et al. .............. 324/96 |
| 5,912,766 A | 6/1999 | Pattie .................... 514/255.01 |
| 5,933,000 A | 8/1999 | Bosselmann et al. ......... 324/96 |

* cited by examiner

Primary Examiner—Georgia Epps
Assistant Examiner—William Choi
(74) Attorney, Agent, or Firm—St. Onge Steward Johnston & Reens LLC

(57) ABSTRACT

A proximity detector for detecting the position of a magnetic target having a transceiver module with a light emitting source, an optical detector, and a 2×2 optical coupler joining the light emitting source and optical detector is provided. A sensor having an outer case houses a collimating lens, a polarizer, a Faraday material, and a mirror. A multi-mode optical fiber connects the transceiver module to the sensor. Preferably, the proximity detector detects the position of the magnetic target, which is substantially axially spaced from the sensor, using a single polarizer aligned with a single Faraday material. Preferably, the Faraday material comprises an iron garnet material, and most preferably a bismuth iron garnet material.

20 Claims, 2 Drawing Sheets

OPTICAL PROXIMITY DETECTOR

CLAIM OF PRIORITY

This application claims the benefit of U.S. Provisional Application No. 60/138,622 filed Jun. 11, 1999.

FIELD OF THE INVENTION

The invention relates to a device for detecting the proximity of a magnetic target, and more specifically to an optical proximity detector which employs the Faraday effect to so detect the proximity of a magnetic target thereto.

BACKGROUND OF THE INVENTION

When a beam of polarized light passes through an optical material known as a "Faraday material", which is exposed to a magnetic field, the Faraday effect causes the material to shift the plane of polarization of the light beam by an angle which is proportional to the strength of the magnetic field. Typically, the magnetic target which is placed in the lines of a magnetic field may take the form of a mechanical device such as a rotating shaft or a door. The change in position of the mechanical device relative to the optical sensor can be detected by the Faraday effect associated with the variation of the magnetic field strength as a result of the magnetic target's change in position within the magnetic field. Various instrument configurations have been developed to exploit the Faraday effect of a selected material in order to detect the position of such a mechanical device, and the detection of a mechanical device's position with optical transducers which measure variations in the intensity of a magnetic field modulated by a magnetic target is well-known. However, although the prior art is highly developed, a number of deficiencies still exist.

U.S. Pat. No. 4,947,035 to Zook discloses a fiber-optic transducer having a 2×1 bidirectional coupler, a fiber, a graded index, or GRIN, lens which collimates light and supplies it to a polarizer, and a permanent magnet radially spaced from the sensor axis. The transducer measures modulation of a magnetic field caused by the mechanical motion of a target device.

U.S. Pat. Nos. 5,149,962; 5,214,377; 5,334,831 and 5,399,853 to Maurice disclose a proximity detector having a pair of fibers with an input polarizer and a second polarizer acting as an analyzer entering into a second optical fiber.

U.S. Pat. No. 5,192,862 to Rudd discloses a polarizer-less optic sensor having a magneto-optical material which exhibits the Faraday effect to provide a phase grating, wherein the intensity of the input light's center beam and diffracted orders change with the magnitude of a magnetic field.

All of these prior art references suffer from a number of disadvantages. One such disadvantage of many of the configurations disclosed in the prior art is that they typically require a polarizing beam splitter component which serves to pass a component of the input light to a particular polarization state as it passes through multiple ports. This is typically done to track optical intensity or polarization states in order to provide-increased sensitivity for the detector.

Another disadvantage of the prior art optical proximity detectors is that they often require a reference path to track the optical intensity or polarization states from the input light source. This, in turn, may disadvantageously require a single mode fiber or more than one fiber to connect a transceiver and sensor. Requiring a reference path may also disadvantageously necessitate the use of more than one optical source and detector.

Yet another disadvantage of the prior art optical proximity sensors is that light typically passes through a sensor with an entrance and exit fiber, where light entering the sensor is directed down a different fiber than the one that delivered it. Such a configuration also disadvantageously requires more than one linear polarizer.

Still another disadvantage of prior designs for optical proximity sensors has been that, when used with certain Faraday materials, they require that the sensor have a permanent magnet radially positioned in order to achieve the proper sensitivity, and that the light source and optical fiber be precisely configured and selected to correspond with the sensor. Such a design limits the applications for which the sensor can be used and increases its manufacturing costs, as relative position and alignment of the components become more critical.

What is desired therefore is an optical proximity detector which does not require a polarizing beam splitter component which serves to pass a component of the input light to a particular polarization state as it passes through multiple ports, which does not require a reference path to track the optical intensity or polarization states from the input light source, which is configured such that light entering the sensor is not directed down a different fiber than the one that delivered it, and which does not require that the sensor have a permanent magnet radially positioned in order to achieve the proper sensitivity, and that the light source and optical fiber be precisely configured and selected to correspond with the sensor.

SUMMARY OF THE INVENTION

Accordingly, an object of the invention is to provide an optical proximity detector which employs a fiber optic beam splitter having a multimode fiber with a matched optical source.

Another object of the invention is to provide an optical proximity detector which employs a single optic fiber connecting a transceiver and a sensor wherein no reference path is required to track optical intensity or polarization states.

A further object of the invention is to provide an optical proximity detector which is reflective and not transmissive, and wherein substantially all of the light entering a sensor is redirected back down the same optical fiber which delivers it.

Yet another object of invention is to provide optical proximity detector which employs a single optical source and a single optical detector.

Another object of the invention is to provide in optical proximity detector which is arranged such that the proximity of a target directly correlates with the intensity of the light collected at the detector and is not calculated by processing of a reference channel and a probe channel.

Still another object of invention is to provide optical proximity detector which can resolve the position of the target as well as report a binary position status.

Other objects of the invention will be obvious and may in part appear hereinafter.

These and other objects of the present invention are achieved by provision of a proximity detector for detecting the position of a magnetic target having a transceiver module with a light emitting source, an optical detector, and a 2×2 optical coupler joining the light emitting source and optical detector. A sensor having an outer case houses a collimating lens, a polarizer, a Faraday material, and a mirror. A multimode optical fiber connects the transceiver module to the sensor. Preferably, the proximity detector detects the position of the magnetic target, which is substantially axially spaced from the sensor, using a single polarizer aligned with a single Faraday material. Most preferably, the Faraday material comprises a Bismuth-Iron-Garnet material.

In another aspect, the proximity detector comprises a transceiver module having a light emitting source aligned with a band pass filter, a first optical detector, a second optical detector, a first 2×1 optical coupler, and a second 2×1 optical coupler. The first 2×1 optical coupler joins the first optical detector and the light emitting source. A sensor having a single polarizer is aligned with a single Faraday material, and a single multi-mode optical fiber connects the transceiver module to the sensor. The second optical detector verifies operation of the sensor with the light emitting source, and the second 2×1 optical coupler joins the second optical detector and the light emitting source with the first 2×1 optical coupler.

The invention and its particular features will become more apparent from the following detailed description considered with reference to the accompanying drawings.

DETAILED DESCRIPTION OF THE DRAWINGS

Figure 1:
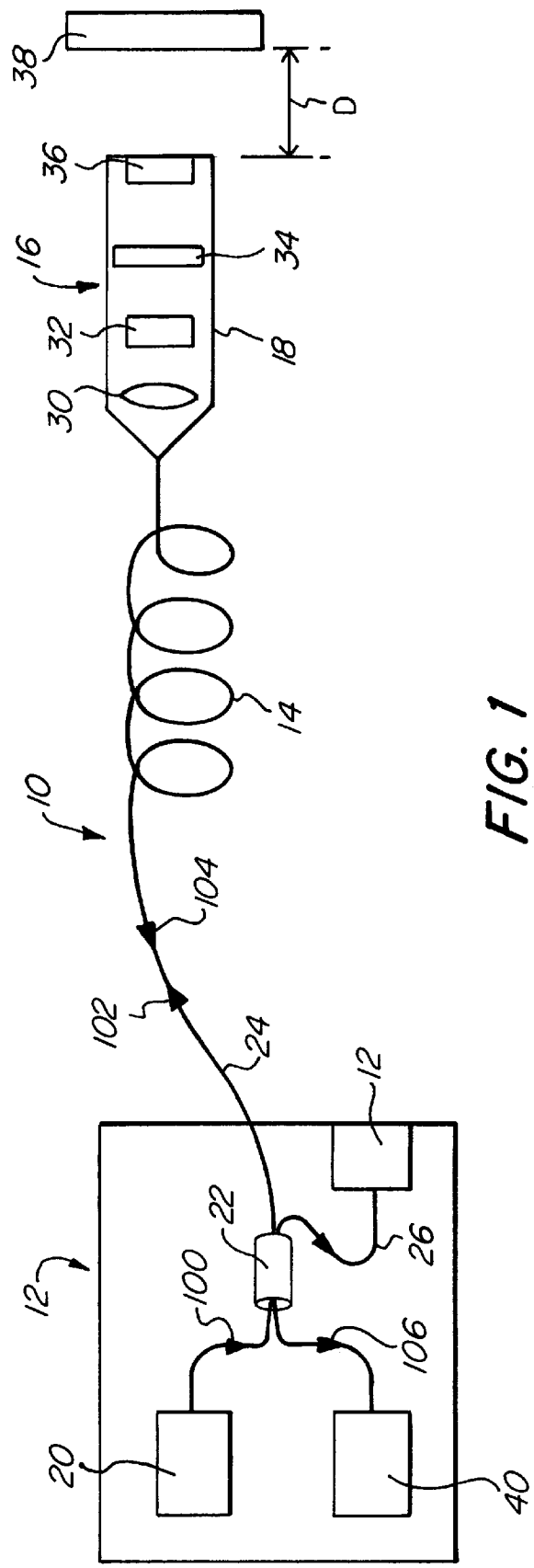
FIG. 1 is diagrammatic representation an optical proximity detector in accordance with the present invention, and wherein the sensor module of the detector is in proximity to a magnetic target.

As depicted in FIG. 1, the proximity detector 10 of the present invention comprises a transceiver module 12, a multimode optical fiber 14 and a sensor 16 housed within an outer case 18. The transceiver module 12 comprises a light emitting source 20 which outputs light (indicated by arrow 100) through a 2×2 fiber optic coupler 22 to the multimode optical fiber 14. Both channels of the light 24,26 exiting the coupler 22 are randomly polarized, due to the nonsingular frequency of source 20 and the many modes that are supported in the multimode fiber 14. Use of the multimode fiber 14, thus, eliminates the need for any polarization beam splitter that serves to pass a component of the input light to a particular polarization state. This was typically done in prior designs in order to increase the sensitivity of the detector by tracking optical intensity or polarization states before further polarization.

Figure 2:
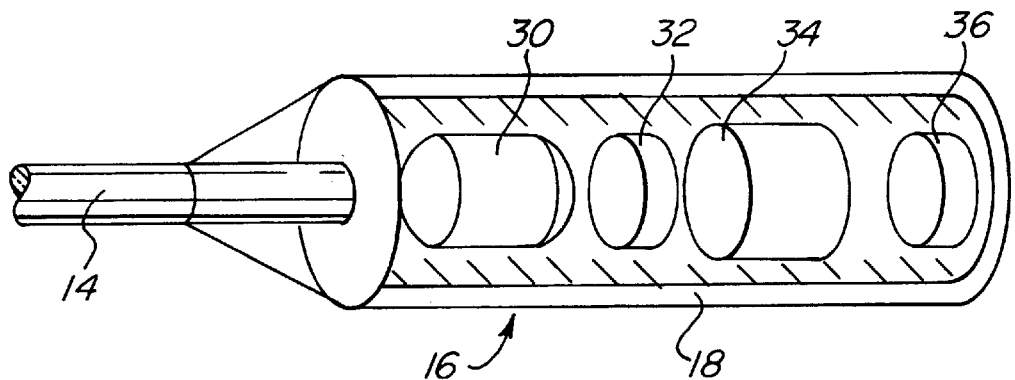
FIG. 2 is a more detailed schematic view of the sensor module of the optical proximity detector of FIG. 1 showing an alignment of components within a housing including a lens, polarizer, Faraday material and mirror.

The unpolarized light is propagated (indicated by arrow 102) down the multimode optical fiber 14 to the sensor module 16. As shown in FIGS. 1 and 2, the sensor module 16 comprises four optical components in series within outer case 18: a condensing lens 30, a linear polarizer 32, a Faraday rotation material 34 and a mirror 36. Within the sensor module 10 the input light is first collimated via the condensing lens 30, and then filtered by a linear polarizer 32 to select one axis of polarization. The polarized light then passes through the Faraday rotator material 34. The Faraday material should be selected such that, when subjected to a magnetic field, the material rotates the polarization state of an incoming light beam to a sufficient degree such that a detectable change in optical intensity attributed to the rotation can be measured by the transceiver module 12. Preferably, the Faraday rotator material 34 is formed from an iron garnet material due to the high Verdet constants of such materials, and most preferably is formed from a bismuth iron garnet (BIG) material because of its extraordinarily high Verdet constant and other favorable properties.

When no magnetic field is present adjacent to the sensor module 16 from a magnetic target 38, the light will pass through the Faraday rotator material 34 with no change to its polarization state, although there may be some attenuation. The light will then reflect off the mirror 36 and be redirected back through the sensor module 16 and down the multimode fiber link 14 (indicated by arrow 104) to the transceiver module 12. The intensity of the returned light will not be substantially affected by passing back through the linear polarizer 32, as all of the return light is of the same polarization as what was first allowed to pass through the polarizer. At the transceiver module 12, a portion of the light is routed (indicated by arrow 106) to a first optical detector 40 via the 2×2 fiber optic coupler 22 where the relatively high amplitude of the photo or optical detector signal will indicate no magnetic target 38 is in proximity to the sensor.

Conversely, when the magnetic target 38 is sufficiently near the sensor module 16 (indicated by distance D), the Faraday material 34 induces a polarization rotation of the input linearly polarized light for each pass through the material. The degree of rotation induced is a function of the proximity of the magnetic target 38. The input linearly polarized light thus passes through the lens 30 and polarizer 32 exactly as described above, but in the presence of a magnetic field, the Faraday material 34 induces a polarization rotation. The light exiting the Faraday material 34 is reflected off the mirror 36 and sent back through the sensor module 16 where the polarization rotation is again induced in the same direction by the Faraday material 34, thereby doubling the rotation. When the new polarization state is sent through the linear polarizer 32, only the component of polarization that aligns with the polarizer axis will pass. In this manner, the degree of polarization rotation induced by the proximity of the magnetic target 38 manifests itself as a change in the intensity of the light exiting the sensor module 16.

The reflected light is coupled from the sensor module 16 back through the multimode fiber 14 (indicated by arrow 104) and routed to the transceiver module 12. Although the fiber optic coupler 22 directs some of the light back to the light emitting source 20, the balance of the light is directed back to the first optical detector 40. The proximity of the magnetic target 38 correlates directly with the light intensity received by the first optical detector 40. When the target 38 is sufficiently close to the sensor module 16, a maximum polarization rotation of 45 degrees will be induced. As the light first travels through the sensor module 16 and reflects back from the mirror 36, this equates to a 90 degree rotation and maximum rejection by the linear polarizer 32, as the polarization of the light heading into the sensor is "crossed" with the polarization of the light leaving the sensor. The degree of extinction is a function of the how well the linear polarizer 32 can reject an orthogonal component, and the spectral bandwidth. (Typically, the polarization rotation induced by a Faraday rotator material is wavelength dependent). The degree to which a signal generated at the first photo detector 40 decreases from the signal associated with the light emitting source 20 indicates the target's proximity to the sensor.

As depicted in FIG. 2, only a single output channel 24 is forwarded to the sensor 16. The second output channel 26 can be treated to minimize back reflection by careful attention to cleaving, and may serve as a "LASER LIT" indicator while coupled to a second optical detector 42, thereby verifying the operation of the sensor module 16 with the light emitting source 20.

One of the advantages of the proximity detector of the present invention is the use of a light emitting source in conjunction with a multimode optical fiber. The light emitting source 20 may be, for example and not as a limitation to the present invention, a light emitting diode (LED) or a laser diode. A laser diode may be preferred, as such typically delivers light within a more narrow spectrum of emission as compared with a typical LED. The principal advantage of an LED is its relatively low cost and high reliability. However, the LED will emit light over a relatively broad spectrum and will disperse the emitted light over a rather large angle.

The different wavelengths of light emitted by the light pulses from the LED travel at different velocities through an optical fiber and cause spreading of the pulses over time, a phenomenon known as material dispersion. In addition, when light travels at different angles of entry (known as modes) into an optical fiber, such multimode propagation causes the light rays leaving the fiber to interfere both constructively and destructively as they leave the end of the fiber, creating another phenomenon known as modal delay spreading. Such modal delay spreading is a result of the light rays arriving at the distant end of an optical fiber with a different phase relationship then when they started. These phenomena encountered in optical fibers can also affect the polarization state of the light traveling through them.

The advantage of using a multimode fiber is that the input light need not have any particular polarization state and therefore it is not necessary to stabilize, track, control or measure the polarization state of the input light at any point in the system and compare it with another polarization state from the sensor as is done with a reference path or a polarizing beam splitter. The change in the intensity of the input light, whatever its initial and subsequent polarization state, is all that is correlated with the proximity of a magnetic target to the sensor. Therefore, the present invention obviates the need for more complex and expensive polarization-maintaining fibers, single mode optical fibers, or polarizing beam splitters. The proximity detector of the present invention can be used with an LED and a multimode optical fiber with a conventional fiber-optic beam splitter or coupler.

Figure 3:
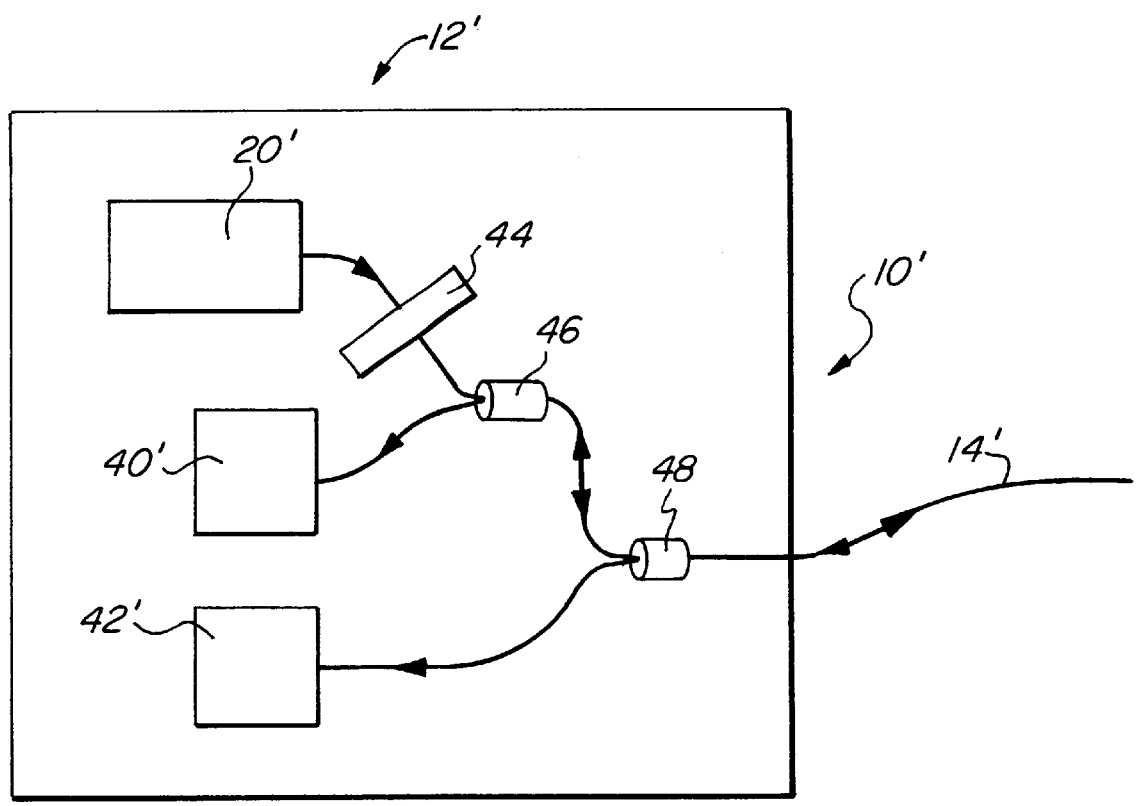
FIG. 3 is diagrammatic representation of an alternate embodiment of the transceiver module comprising a light emitting source in alignment with a band pass filter, a first and second optical detector, and a first and second 2×1 optical coupler.

In another embodiment of the invention, the transceiver module 12' may contain a band pass filter 44 in alignment with a light emitting source 20' in order to alter the sensitivity of the proximity detector 10' as the polarization rotation induced by a particular Faraday rotator material is dependent on the wavelength of the input light source. As depicted in FIG. 3, such a configuration may include a first optical detector 40' joined to the light emitting source 20' by way of a first 2×1 coupler 46. A second optical detector 42' may then be joined to the light emitting source 20' by way of a second 2×1 coupler 48. The first optical detector 40' may serve as a "LASER LIT" indicator, thereby verifying the operation of the sensor module with the light emitting source 20'.

It should be understood that the foregoing is illustrative and not limiting and obvious modifications may be made by those skilled in the art without departing from the spirit of the invention. Accordingly, reference should be made primarily to the accompanying claims, rather than the foregoing specification, to determine the scope of the invention.

What is claimed is:

1. A proximity detector for detecting the proximity of a magnetic target comprising:
    a transceiver module comprising a light emitting source, an optical detector, and an optical coupler, wherein said optical coupler joins said light emitting source and said optical detector;
    a sensor comprising an outer case housing a polarizer and a mirror with a Faraday material disposed therebetween; and
    a multi-mode optical fiber connecting the optical coupler of said transceiver module to the polarizer of said sensor.

2. The proximity detector of claim 1 wherein the transceiver module further comprises a signal processor which determines the position of the magnetic target based upon the intensity of a signal received by said optical detector.

3. The proximity detector of claim 1 wherein said Faraday material comprises an iron garnet material.

4. The proximity detector of claim 3 wherein said Faraday material comprises a bismuth iron garnet material.

5. The proximity detector of claim 1 wherein said optical coupler comprises a 2×2 optical coupler.

6. The proximity detector of claim 1 wherein said sensor further comprises a collimating lens disposed between said multi-mode optical fiber and the polarizer of said sensor.

7. A proximity detector for detecting the proximity of a magnetic target comprising:
    a transceiver module having a light emitting source, an optical detector, and a 2×2 optical coupler, wherein said 2×2 optical coupler joins said light emitting source and said optical detector;
    a sensor having a single polarizer and a mirror with a Faraday material disposed therebetween, wherein said polarizer, said mirror and said Faraday material are in alignment with each other; and
    a single multi-mode optical fiber connecting the optical coupler of said transceiver module to said polarizer of said sensor.

8. The proximity detector of claim 7 wherein the transceiver module further comprises a signal processor which determines the position of the magnetic target based upon the intensity of a signal received by said optical detector.

9. The proximity detector of claim 7 wherein said Faraday material comprises an iron garnet material.

10. The proximity detector of claim 9 wherein said Faraday material comprises a bismuth iron garnet material.

11. The proximity detector of claim 7 wherein said sensor further comprises a collimating lens disposed between said multi-mode optical fiber and the polarizer of said sensor.

12. The optical proximity detector of claim 7 further comprising a second optical detector, wherein said second optical detector verifies operation of said sensor with said light emitting source, and wherein said optical coupler joins said second optical detector and said light emitting source with said first optical detector.

13. A proximity detector for detecting the proximity of a magnetic target comprising:
    a transceiver module having a light emitting source, a band pass filter, a first optical detector, and a first optical coupler, said first optical coupler joining said first optical detector and said light emitting source, and said band pass filter being disposed between said light emitting source and said first optical coupler;
    a sensor having a single polarizer and a mirror, with a Faraday material being disposed therebetween, wherein said polarizer, said mirror and said Faraday material are in alignment with one another; and a single multi-mode optical fiber connecting the first optical coupler of said transceiver module to said polarizer of said sensor.

14. The proximity detector of claim 13 wherein said first optical coupler comprises a 2×1 optical coupler.

15. The proximity detector of claim 13 wherein the transceiver module further comprises a signal processor which determines the position of the magnetic target based upon the intensity of a signal received by said optical detector.

16. The proximity detector of claim 13 wherein said Faraday material comprises an iron garnet material.

17. The proximity detector of claim 16 wherein said Faraday material comprises a bismuth iron garnet material.

18. The proximity detector of claim 13 wherein said sensor further comprises a collimating lens disposed between said multi-mode optical fiber and the polarizer of said sensor.

19. The optical proximity detector of claim 13 further comprising a second optical detector and a second optical coupler, wherein said second optical detector verifies operation of said sensor with said light emitting source, and wherein said second optical coupler joins said second optical detector and said light emitting source with said first optical coupler.

20. The proximity detector of claim 19 wherein said first optical coupler comprises a first 2×1 optical coupler and said second optical coupler comprises a second 2×1 optical coupler.

* * * * *